(12) United States Patent
Skirmont et al.

(10) Patent No.: US 9,392,722 B2
(45) Date of Patent: Jul. 12, 2016

(54) CABLE BACKPLANE ASSEMBLY AND METHOD

(71) Applicant: Brocade Communications Systems, Inc., San Jose, CA (US)

(72) Inventors: David Skirmont, Los Gatos, CA (US); Dan Kilkenny, Pleasanton, CA (US); Anthony Vanderveen, San Jose, CA (US); Peter Doyle, Los Altos, CA (US)

(73) Assignee: BROCADE COMMUNICATIONS SYSTEMS, INC., San Jose, CA (US)

(*) Notice: Subject to any disclaimer, the term of this patent is extended or adjusted under 35 U.S.C. 154(b) by 163 days.

(21) Appl. No.: 14/331,774

(22) Filed: Jul. 15, 2014

(65) Prior Publication Data

US 2015/0116923 A1 Apr. 30, 2015

Related U.S. Application Data

(60) Provisional application No. 61/895,746, filed on Oct. 25, 2013, provisional application No. 61/895,755, filed on Oct. 25, 2013, provisional application No. 61/915,975, filed on Dec. 13, 2013.

(51) Int. Cl.
*H05K 7/14* (2006.01)
*G06F 1/18* (2006.01)
*G06F 1/20* (2006.01)

(52) U.S. Cl.
CPC .............. *H05K 7/1492* (2013.01); *G06F 1/182* (2013.01); *G06F 1/189* (2013.01); *G06F 1/20* (2013.01); *Y10T 29/49222* (2015.01)

(58) Field of Classification Search
CPC ........... G06F 1/182; G06F 1/189; G06F 1/20; H05K 7/1492; Y10T 29/49222

USPC ............... 439/49, 63, 95, 248, 540.1, 607.02, 439/607.23, 607.53; 361/679.31; 29/884
See application file for complete search history.

(56) References Cited

U.S. PATENT DOCUMENTS

| | | | | |
|---|---|---|---|---|
| 6,219,235 B1* | 4/2001 | Diaz | .................... | H05K 7/1425 174/72 A |
| 6,816,390 B1* | 11/2004 | Barringer | ................ | G06F 1/184 361/679.32 |
| 7,140,911 B1 | 11/2006 | Rector et al. | | |
| 7,909,622 B2 | 3/2011 | Pepe et al. | | |
| 7,980,859 B2 | 7/2011 | Mizumura et al. | | |
| 8,292,644 B2 | 10/2012 | Hamner et al. | | |
| 2003/0174996 A1* | 9/2003 | Henschel | ............. | G02B 6/2804 385/135 |
| 2005/0041389 A1* | 2/2005 | Martin | .................... | G06F 1/183 361/679.31 |
| 2008/0089656 A1* | 4/2008 | Wagner | .................... | H04Q 1/13 385/135 |
| 2014/0037259 A1* | 2/2014 | Bragg | .................. | H01R 13/659 385/135 |
| 2014/0133810 A1* | 5/2014 | Schneider | ............ | G02B 6/3608 385/89 |

\* cited by examiner

*Primary Examiner* — Anthony Haughton
*Assistant Examiner* — Yahya Ahmad
(74) *Attorney, Agent, or Firm* — Innovation Counsel LLP; Serge J. Hodgson

(57) ABSTRACT

An electronic device includes a bulkhead assembly. The bulkhead assembly includes a bulkhead and one or more cable cassettes coupled to the bulkhead. The cable cassettes include floating connectors. The cable cassettes are modular assemblies that contain all the wiring and connectors. As the connectors float in the cable cassettes, the cable cassettes are blind mated to the bulkhead as standalone units.

19 Claims, 12 Drawing Sheets

CABLE BACKPLANE ASSEMBLY AND METHOD

RELATED APPLICATIONS

This application claims the benefit of: U.S. Provisional Application No. 61/895,746 filed on Oct. 25, 2013, entitled "CABLE BACKPLANE ASSEMBLY AND METHOD" of Vanderveen et al.; U.S. Provisional Application No. 61/895,755 filed on Oct. 25, 2013, entitled "CABLE CASSETTE COVER AND METHOD" of Skirmont et al.; and U.S. Provisional Application No. 61/915,975 filed on Dec. 13, 2013, entitled "CABLE BACKPLANE CASSETTE AIR FLOW SYSTEM AND METHOD" of Vanderveen et al., which are all incorporated herein by reference in their entirety.

BACKGROUND

1. Field

The present application relates to the field of electronics, and more particularly, to structures for electronic devices and related methods.

2. Description of the Related Art

In a traditional switch, a printed circuit board (PCB) backplane has connectors that interface with blades of the switch. The PCB backplane includes a dielectric core and electrically conductive traces supported by the dielectric core. Signals between blades and generally between components of the switch are propagated along the conductive traces.

However, as more functionality and components are combined to form larger switches, the required distance of the traces of the PCB backplane to interconnect the various components correspondingly increases. Further, as switches process more information and at higher speeds, the signals propagated along the conductive traces must travel at faster rates and with lower losses. Thus, PCB backplanes are placing fundamental restrictions on the size and speed at which switches can operate.

SUMMARY

In accordance with one embodiment, an electronic device, e.g., switch, includes a bulkhead assembly. The bulkhead assembly includes a bulkhead and one or more cable cassettes coupled to the bulkhead. The cable cassettes include floating connectors.

The bulkhead assembly replaces a traditional PCB backplane from the standpoint of the customer. More particularly, one or more blades, e.g., line cards, switch fabrics, and/or management modules, can be readily connected to and disconnected from the bulkhead assembly.

Further, the cable cassettes are modular assemblies that contain all the high speed wiring and connectors. Accordingly, instead of performing a series of complex and labor consuming wiring on the bulkhead to form the long distance high speed interconnections, the cable cassettes are simply mounted to the bulkhead. As the connectors float in the cable cassettes, the cable cassettes are blind mated to the bulkhead as standalone units.

These and other features in accordance with various embodiments will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
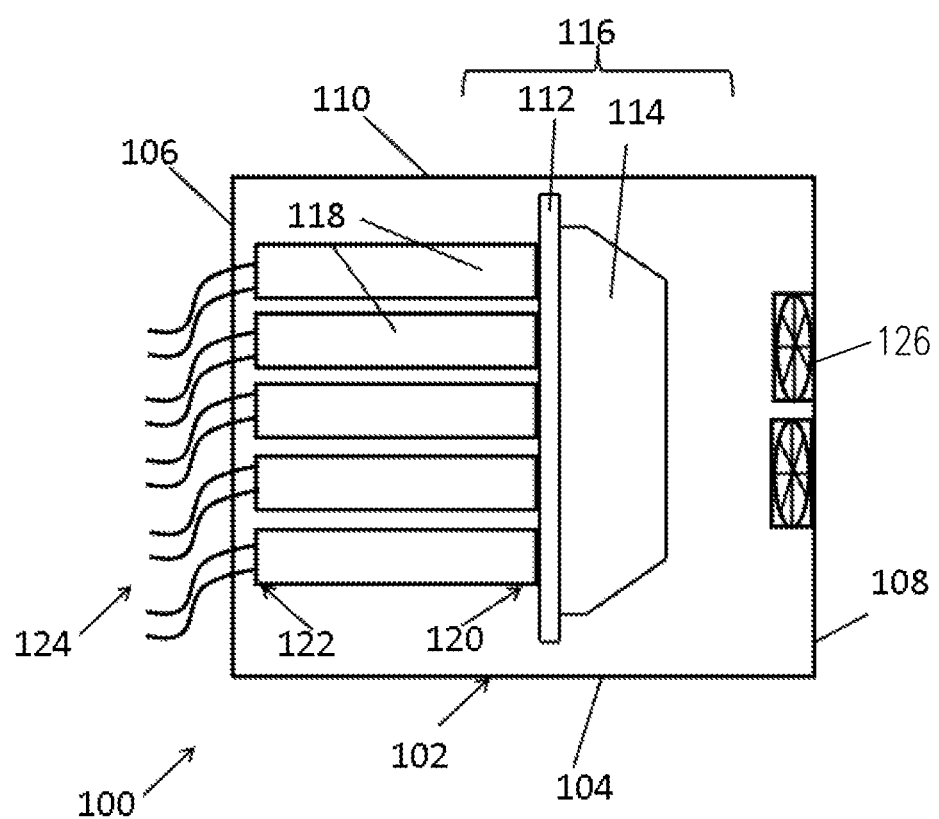
FIG. 1 is a side schematic diagram of an electronic device in accordance with one embodiment.

FIG. 1 is a side schematic diagram of an electronic device 100, e.g., a switch, in accordance with one embodiment.

Electronic device 100 includes a chassis 102 that forms that framework that supports the various components of electronic device 100.

Generally, electronic device 100 includes a horizontal base 104, e.g., that extends in a first direction. Electronic device 100 further includes a vertical front face 106, e.g., that extends in a second direction perpendicular to the first direction of horizontal base 104. Electronic device 100 further includes a vertical rear face 108 that also extends in the second direction perpendicular to the first direction of horizontal base 104. For discussion purposes herein, front face 106 is in a vertical front plane of electronic device 100 and rear face 108 is an approximately parallel vertical rear plane of electronic device 100.

Electronic device 100 further includes a horizontal top 110 parallel to base 104 and perpendicular to faces 106, 108. Faces 106, 108 extend between base 104 and top 110. Although the terms vertical, horizontal and similar terms are used herein, the terms are used for simplicity to generally mean in a first direction and a perpendicular second direction and it is to be understood that the terms are not gravitationally referenced.

Located within chassis 102 is a bulkhead 112. In one embodiment, bulkhead 112 is a flat plate, e.g., a machined aluminum plate, extending in the vertical direction. Bulkhead 112 includes cutouts and other openings to accommodate various components of electronic device 100.

One or more cable cassettes 114 are coupled to bulkhead 112. Cable cassettes 114 include internal cabling and connectors that mount to the cutouts in bulkhead 112. This cabling allows high speed signal propagation thus allowing the size of electronic device 100 to be relatively large, i.e., to accommodate a large amount of components.

Further, bulkhead 112 and cable cassettes 114 form a bulkhead assembly 116 that replaces a traditional PCB backplane from the standpoint of the customer, e.g., the user of electronic device 100. More particularly, one or more blades 118, e.g., line cards, switch fabrics, and/or management modules, can be readily connected to and disconnected from bulkhead assembly 116.

Further, cable cassettes 114 are modular assemblies that contain all the wiring and connectors. Accordingly, instead of performing a series of complex and labor consuming wiring on bulkhead 112 to form the long distance high speed interconnections, cable cassettes 114 are simply mounted to bulkhead 112. Cable cassettes 114 are preassembled and mass produced thus minimizing fabrication cost.

Further, cable cassettes 114 are readily upgradeable. More particularly, instead of rewiring connectors on bulkhead 112, a cable cassette 114 can readily be removed and replaced with a new upgraded cable cassette 114.

Blades 118 include bulkhead assembly connector ends 120 and opposite wiring ends 122. Bulkhead assembly connector ends 120 mechanically and electrically interconnect with bulkhead assembly 116.

Wiring ends 122 include various ports or other data structures as well as mechanical structures, e.g., ejector handles, to allow securement and removal of blades 118 from chassis 102. For example, external cabling 124 is connected to blades 118 at wiring ends 122.

Located at or adjacent rear face 108 of electronic device 100 is one or more fans 126, sometimes called fan Field Replaceable Units (FRUs). Fans 126 circulate air through electronic device 100 to insure electronic device 100 including the components therein are maintained at proper operating temperatures.

Figure 2:
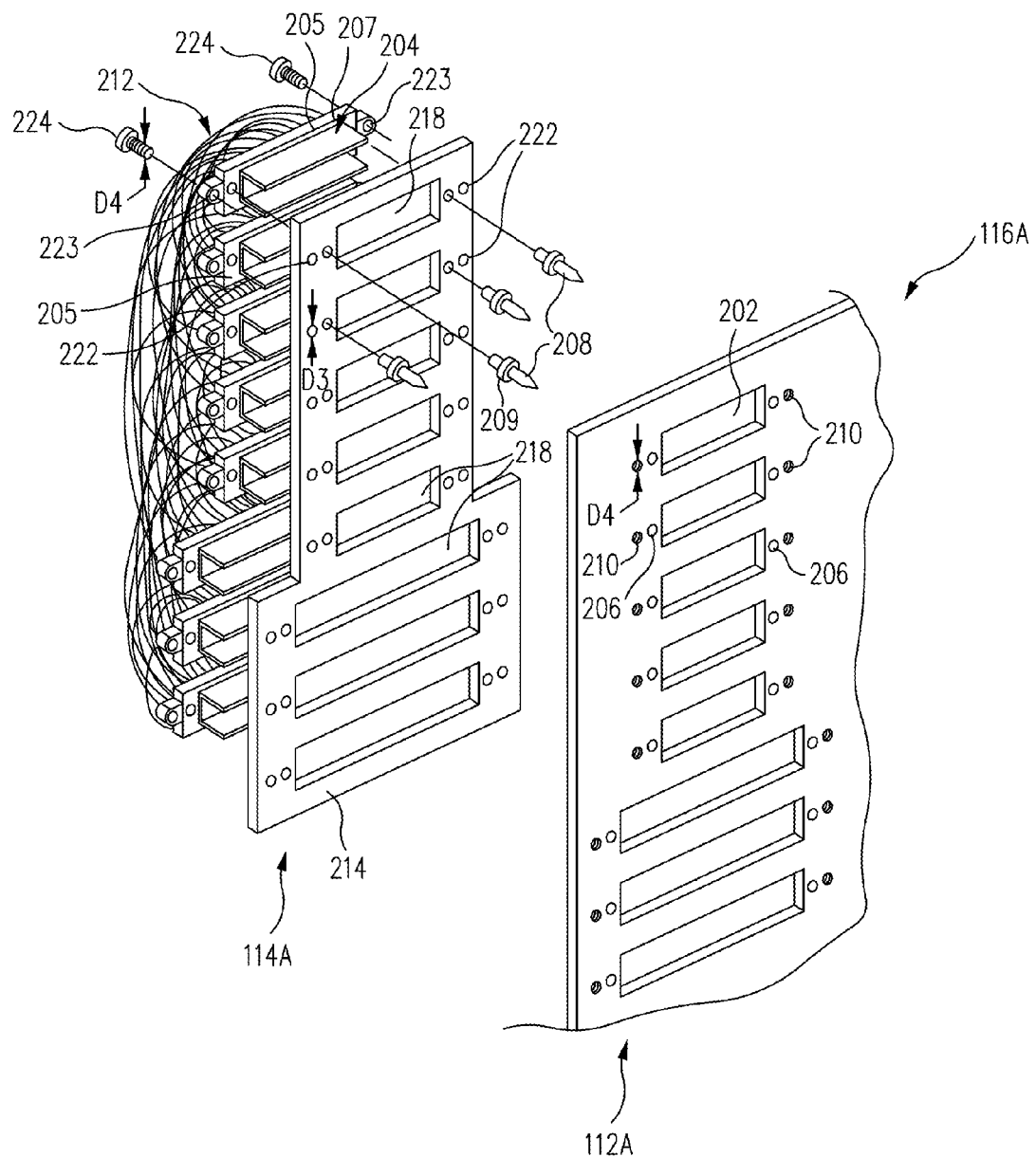
FIG. 2 is an exploded perspective view of a bulkhead assembly including a cable cassette and a bulkhead in accordance with one embodiment.

FIG. 2 is an exploded perspective view of a bulkhead assembly 116A including a cable cassette 114A and a bulkhead 112A in accordance with one embodiment. Bulkhead assembly 116A, cable cassette 114A, and bulkhead 112A of FIG. 2 are similar to bulkhead assembly 116, cable cassette 114, and bulkhead 112 of FIG. 1.

Referring now to FIG. 2, bulkhead 112A is a substitute for a conventional PCB backplane. Bulkhead 112A provides the structure and sheer plane for the system. Bulkhead 112A also provides the equivalent datum (reference) structure for the system, providing high precision x, y, and z direction datums.

In accordance with this embodiment, bulkhead 112A is in the form of a planar plate, e.g., aluminum or other rigid conductive or nonconductive material, and provides a sheer plane for the system. Bulkhead 112A has rectangular cutouts 202 for cable connectors 204 of cable cassette 114A.

Directly adjacent cutouts 202 are guidepin guideholes 206 for receiving guidepins 208 of connectors 204. Adjacent guidepin guideholes 206 are bulkhead screw holes 210 for securely fastening cable cassette 114A to bulkhead 112A after connectors 204 have been located within cutouts 202 of bulkhead 112A.

In accordance with this embodiment, cable cassette 114A is a modular self-contained cable cassette that allows for assembly of cables 212 to be done inside cable cassette 114A as a standalone unit. Connectors 204 float in cable cassette 114A. This allows cable cassette 114A as a standalone unit to be blind mated to bulkhead 112A and chassis 102 (see FIG. 1). Further, this allows blades 118 (see FIG. 1) to be installed to cable cassette 114A in a hot swap, blind mate method.

In accordance with this embodiment, cable cassette 114A includes a front template 214, connectors 204, cabling 212, guidepins 208, and an optional protective cover (the optional protective cover is not illustrated in FIG. 2 but is discuss below). Cabling 212, e.g., twin axial cabling, provides intra-cassette connections between connectors 204 of cable cassette 114A and allows connectors 204 to be located at a distance from one another. Cables 212 are high-performance cables that allow high speed signals (data) to be propagated over a relatively large distance, e.g., between connectors 204, without large impedance losses.

Connectors 204 include connector bodies 205 and connector plugs 207 protruding from connector bodies 205. Connector plugs 207 include signal pins to which blades, e.g., see blades 118 of FIG. 1, are electrically connected thereto.

One challenge is that connectors 204 of cable cassette 114A must be precisely aligned and fixed in position to bulkhead 112A to allow blades 118 to be coupled thereto. To allow this precise alignment, connectors 204 float in front template 214 of cable cassette 114A.

To provide the float, rectangular connector openings 218 in front template 214 of cable cassette 114A are larger (oversized) than connectors 204, i.e., connector plugs 207, of cable cassette 114A. Thus, connectors 204 of cable cassette 114A can move slightly within connector openings 218 of front template 214.

Figure 3:
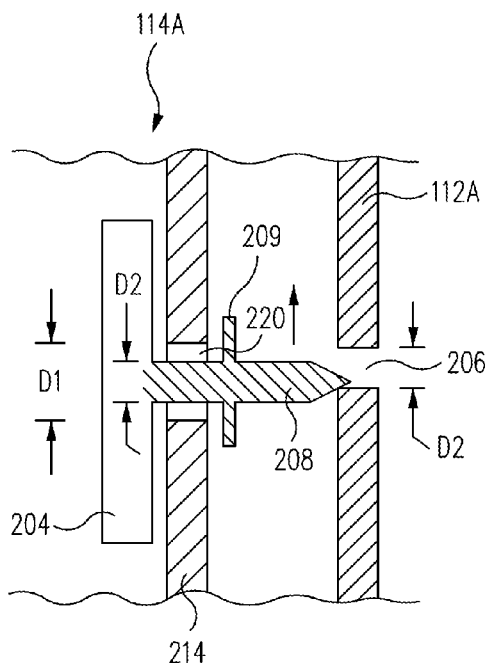
FIG. 3 is a cross-sectional view of a portion of the cable cassette being mounted to the bulkhead of FIG. 2 in accordance with one embodiment.
Figure 4:
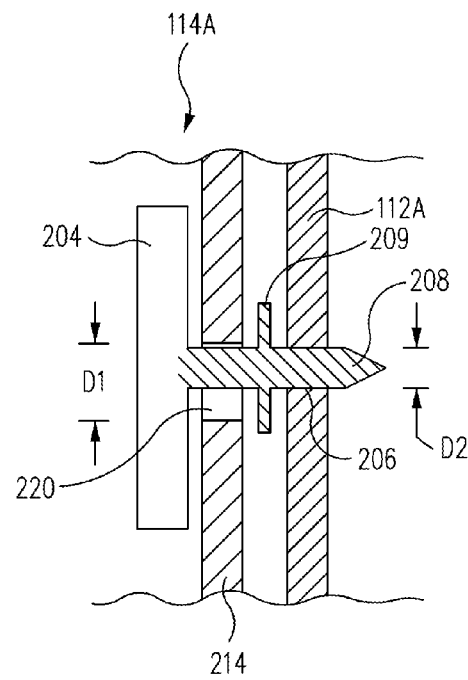
FIG. 4 is a cross-sectional view of the portion of the cable cassette mounted to the bulkhead of FIG. 2 in accordance with one embodiment.

FIG. 3 is a cross-sectional view of a portion of cable cassette 114A being mounted to bulkhead 112A of FIG. 2 in accordance with one embodiment. FIG. 4 is a cross-sectional view of the portion of cable cassette 114A mounted to bulkhead 112A of FIG. 2 in accordance with one embodiment.

Referring now to FIGS. 2, 3, and 4 together, connectors 204 are secured to front template 214 by guidepins 208 that pass though respective guidepin openings 220 in front template 214. The diameter D1 of guidepin openings 220 in front template 214 is larger than the diameter D2 of guidepins 208. Accordingly, guidepins 208 can move within guidepin openings 220 in front template 214. This, in turn, allows connectors 204 to move within connector openings 218 in front template 214.

Guidepins 208 include guidepin shoulders 209 having a diameter larger than diameter D1 of guidepin openings 220 in front template 214. Accordingly, guidepins 208 secure connectors 204 to front template 214 while at the same time allowing connectors 204 to float relative to front template 214.

Further, guidepin guide holes 206 in bulkhead 112A are approximately the same size as guidepins 208 of connectors 204, i.e., have diameter D2. Thus, guidepins 208 fit snugly within guidepin guide holes 206 in bulkhead 112A as illustrated in FIG. 4. Accordingly, once guidepins 208 are secured within the guidepin guide holes 206 in bulkhead 112A, connectors 204 of cable cassette 114A are precisely fixed in location (registered) with respect to bulkhead 112A. In this manner, tolerance between the location of connectors 204 of cable cassette 114A and bulkhead 112A is accommodated.

In one embodiment, guidepins 208 are press fit into guidepin guide holes 206 to register the location of connectors 204 to bulkhead 112A. In other embodiments, in addition to or alternatively to guidepins 208, connectors 204 are screwed to bulkhead 112A or directly attached using other types of mechanical fasteners.

Cable cassette 114A is then screwed or otherwise fastened to bulkhead 112A thus locking connectors 204 in place within bulkhead 112. For example, connectors 204 include bulkhead screw openings 223 and front template 214 includes bulkhead screw openings 222. Bulkhead screws 224 are inserted through bulkhead screw openings 223 of connectors 204, through bulkhead screw openings 222 in front template 214, and are screwed into bulkhead screw holes 210 of bulkhead 112A to fasten cable cassette 114A to bulkhead 112A.

In one embodiment, the diameter D3 of bulkhead screw openings 222 in front template 214 is greater than the diameter D4 of bulkhead screws 224 and bulkhead screw holes 210 in bulkhead 112A. Accordingly, front template 214 can float relative to bulkhead screws 224 and bulkhead screw holes 210 in bulkhead assembly 112A. In this manner, tolerance between the position of front template 214 and bulkhead 112A is accommodated. In one embodiment, bulkhead screw openings 223 of connectors 204 have a diameter greater than the diameter D4 of bulkhead screws 224 and bulkhead screw holes 210 in bulkhead 112A to accommodate tolerance in the position of connectors 204.

Figure 5:
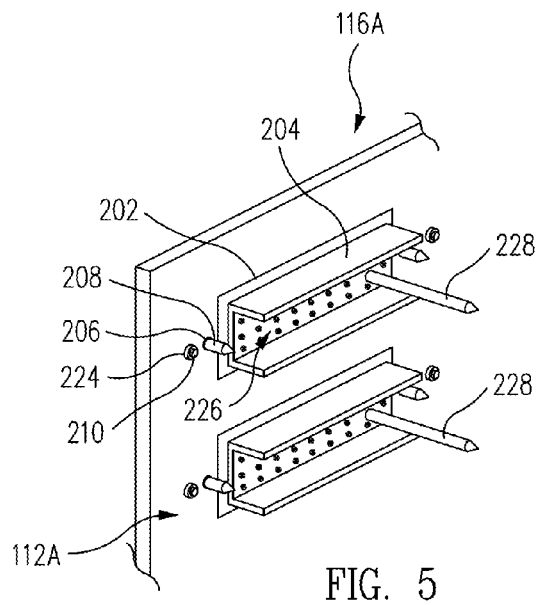
FIG. 5 is a partial perspective view of the bulkhead assembly illustrating connectors of the cable cassette mounted within the bulkhead of FIG. 2 in accordance with one embodiment.

Once cable cassette 114A (and all cable cassettes 114) is mounted to bulkhead 112A to form bulkhead assembly 116A, bulkhead assembly 116A replaces a traditional PCB backplane from the standpoint of the customer, e.g., the user of electronic device 100. FIG. 5 is a partial perspective view of bulkhead assembly 116A illustrating connectors 204 of cable cassette 114A mounted within bulkhead 112A of FIG. 2 in accordance with one embodiment.

Referring now to FIG. 5, connectors 204 include signal pins 226 and blade alignment pins 228 to which blades, e.g., see blades 118 of FIG. 1, are electrically and physically connected thereto. More particularly, as a blade 118 is moved towards one or more connectors 204, the blade 118, e.g., a blade alignment pin hole of the blade 118, is engaged with one or more blade alignment pins 228. The respective blade 118 is then slid down and guided by the blade alignment pin(s) 228 to align the mating connectors of the blade 118 with signal pins 226.

Figure 6:
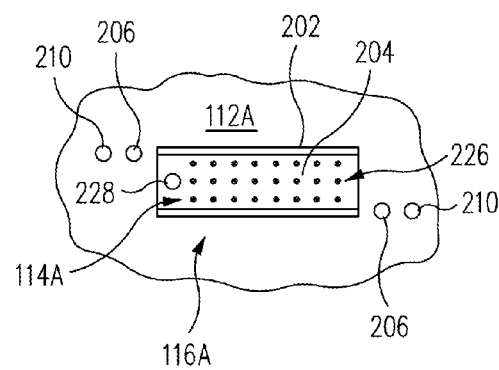
FIG. 6 is a front plan view of a bulkhead assembly illustrating connectors of a cable cassette mounted within a bulkhead in accordance with another embodiment.

FIG. 6 is a front plan view of bulkhead assembly 116A illustrating a connectors 204 of cable cassette 114A mounted within bulkhead 112A of FIG. 2 in accordance with another embodiment. Referring now to FIGS. 5 and 6 together, although a particular arrangement of signal pins 226, blade alignment pins 228, guidepins 208 and guidepin guide holes 206, bulkhead screws 224 and bulkhead screw holes 210 are illustrated in FIG. 5, in other embodiments, other arrangements are used depending on the particular application, for example, as shown in FIG. 6.

Figure 7:
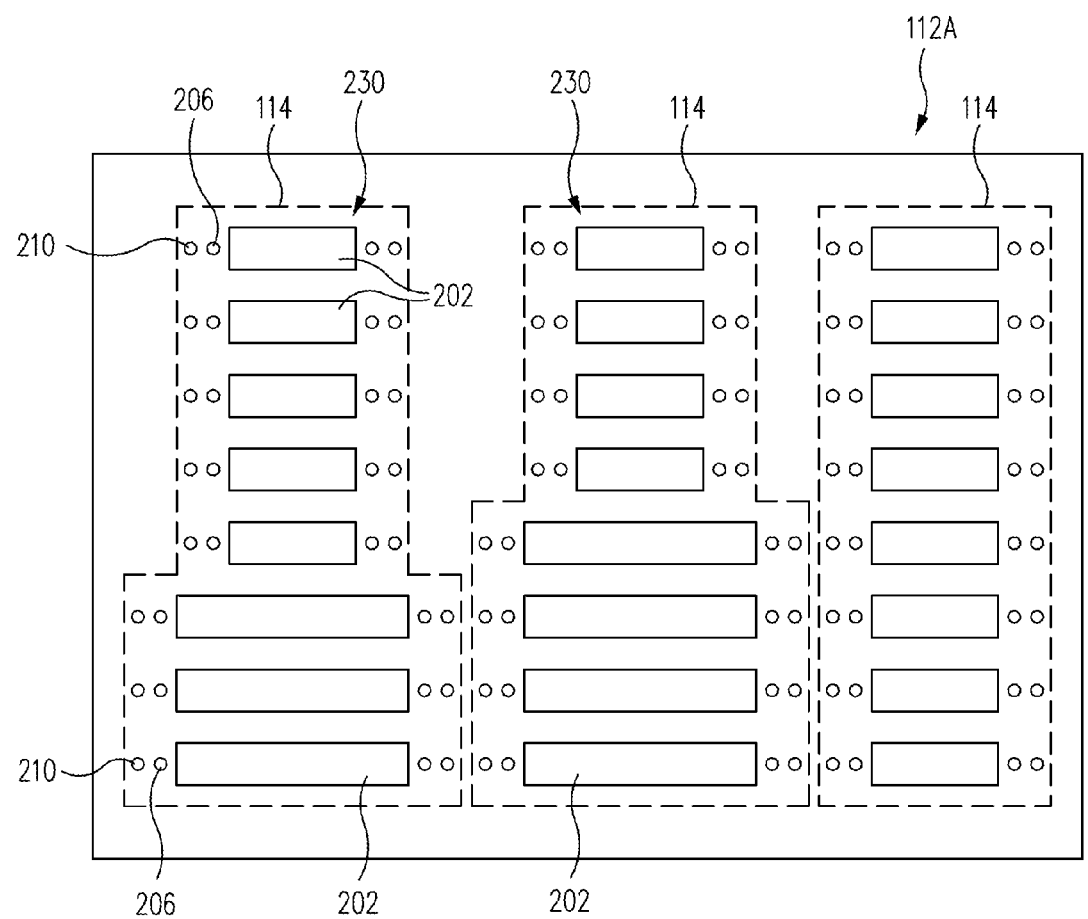
FIG. 7 is a front plan view of the bulkhead of FIG. 2 in accordance with one embodiment.

FIG. 7 is a front plan view of bulkhead 112A of FIG. 2 in accordance with one embodiment. Referring now to FIG. 7, bulkhead 112A includes a plurality of cable cassette templates 230, e.g., patterns of cutouts 202, guidepin guide holes 206, and bulkhead screw holes 210. Each cable cassette template 230 accommodates a single cable cassette 114 in accordance with this embodiment. The outlines of various cable cassettes 114 are indicated in dashed lines in FIG. 7.

Figure 8:
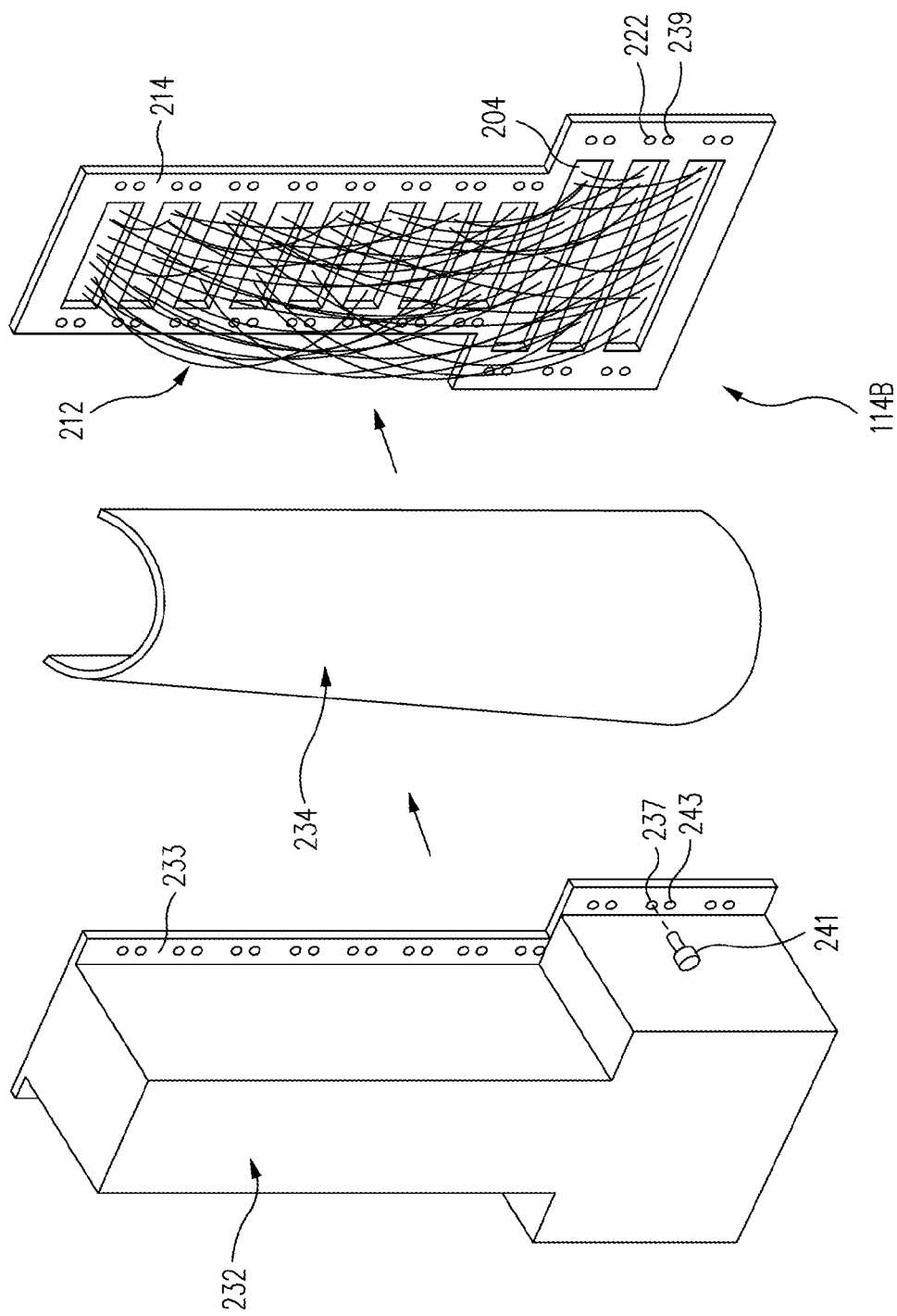
FIG. 8 is an exploded perspective view of a cable cassette in accordance with one embodiment.

FIG. 8 is an exploded perspective view of a cable cassette 114B in accordance with one embodiment. Cable cassette 114B of FIG. 8 is similar to cable cassettes 114, 114A as discussed above.

Referring now to FIG. 8, cabling 212 is relatively fragile as well as the connections between cabling 212 and connectors 204 of cable cassette 114B. For example, cabling 212 can be damaged during handling, e.g., installation or removal, of cable cassette 114B. Further, during use of electronic device 100, vibration can cause cables 212 to become abraded due to vibrational contact between cables 212 and another structure of electronic device 100.

Further, in one embodiment, front template 214 of cable cassette 114B is formed of a semi-flexible material, e.g., is formed of sheet metal. Thus, front template 214 is subject to easily bending upon the application of force thereon. Bending of front template 214 is undesirable, e.g., can cause misalignment of connectors 204 of cable cassette 114B or other problems.

Thus, in accordance with this embodiment, cable cassette 114B includes a protective cover 232 that mounts to front template 214 of cable cassette 114B and around cabling 212. Cover 232 protects cabling 212 during handling.

Further, cover 232, e.g., formed of folded sheet metal, is relatively rigid adding to the strength of front template 214. In one embodiment, cover 232 is screwed or otherwise fastened to front template 214.

In one embodiment, cover 232 includes a mounting flange 233 that is mounted to the periphery of an inner surface of front template 214. Mounting flange 233 includes front template mounting openings 237 corresponding to threaded cover mounting openings 239 of front template 214. Cover screws 241 are passed through front template mounting openings 237 of cover 232 and screwed into threaded cover mounting openings 239 of front template 214 to mount cover 232 to front template 214. However, in other embodiments, cover 232 is mounted to front template 214 in other embodiments, e.g., welded, crimped, or using other fasteners.

In accordance with this embodiment, referring to FIGS. 2 and 8 together, cover 232 further includes bulkhead screw openings 243 aligned with bulkhead screw openings 222 in front template 214. Bulkhead screws 224 are passed through bulkhead screw openings 243 and respective bulkhead screw openings 222 and threaded into bulkhead screw holes 210 to mount cable cassette 114B to bulkhead 112A as described above.

In one embodiment, bulkhead screws 224 pass through bulkhead screw openings 243 in cover 232 and through bulkhead screw openings 223 in connector bodies 205 to screw connectors 204 to bulkhead 112A. In another embodiment, bulkhead screws 224 do not pass through connectors 204. For example, mounting flange 233 of cover 232 is pressed down on connectors 204 by bulkhead screws 224. As set forth above, bulkhead 112A does all of the alignment and bulkhead screws 224 fix everything into position.

For example, bulkhead screw openings 243 have the same diameter D3 (see FIG. 2) as bulkhead screw openings 222 allowing some float of cable cassette 114B with respect to bulkhead screws 224 and bulkhead 112A as described above.

In one embodiment, to prevent cover 232 itself from damaging cabling 212, a protective fabric 234, sometimes called a protective sleeve 234, is provided around cabling 212. Protective fabric 234, e.g., made of cloth, is located between cabling 212 and cover 232. Accordingly, protective fabric 234 prevents direct contact and damage between cabling 212 and cover 232.

In one embodiment, cover 232 is made of a material, or includes a lining, to prevent damaging cabling 212 and does not include protective fabric 234. In another embodiment, only protective fabric 234 is used to protect cabling 212 without use of cover 232.

Figure 9:
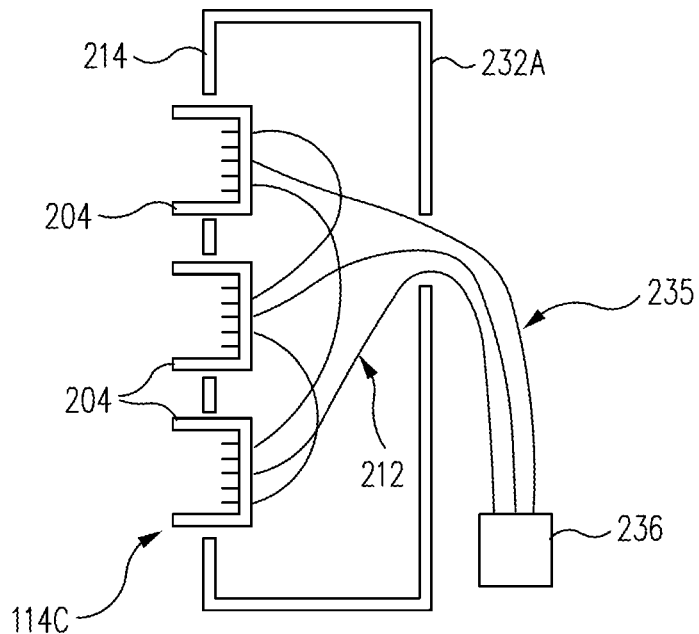
FIG. 9 is a cross-sectional in view of a cable cassette including a pigtail having a pigtail connector in accordance with one embodiment.

FIG. 9 is a cross-sectional in view of a cable cassette 114C including a pigtail 235 having a pigtail connector 236 in accordance with one embodiment. In accordance with this embodiment, cabling 212 is connected to pigtail connector 236 of pigtail 235 that extends outside of the enclosure defined by front template 214 and a cover 232A for external connection to cable cassette 114C.

Figure 10:
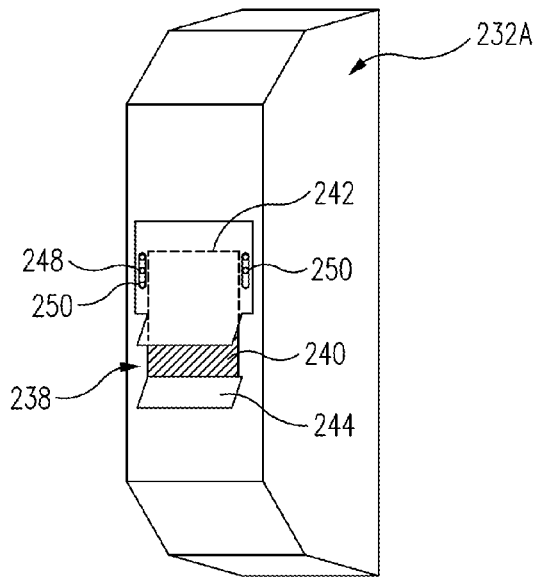
FIG. 10 is a rear perspective view of a cover of a cable cassette having a pigtail exit in accordance with one embodiment.
Figure 12:
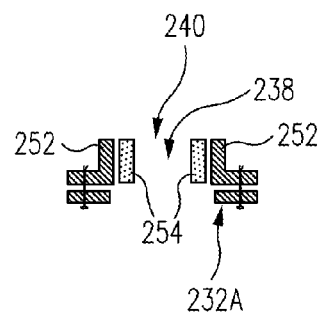
FIG. 12 is a cross-sectional view of the pigtail exit of the cover along the line XII-XII of FIG. 11 in accordance with one embodiment.
Figure 11:
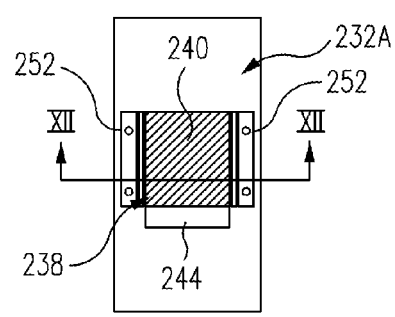
FIG. 11 is a rear plan view of the pigtail exit of the cover of FIG. 10 in accordance with one embodiment.
Figure 13:
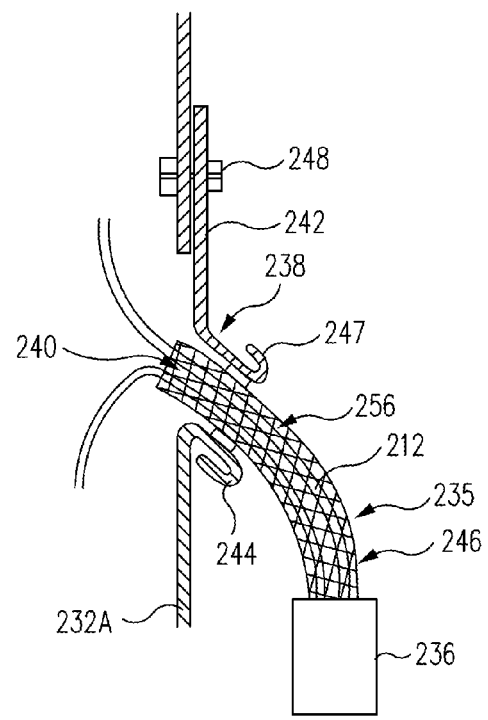
FIG. 13 is a cross-sectional view of the pigtail extending through the pigtail exit in accordance with one embodiment.

FIG. 10 is a rear perspective view of cover 232A having a pigtail exit 238, sometimes called a wiring exit port, in accordance with one embodiment. FIG. 11 is a rear plan view of pigtail exit 238 of cover 232A of FIG. 10 in accordance with one embodiment. FIG. 12 is a cross-sectional view of pigtail exit 238 of cover 232A along the line XII-XII of FIG. 11 in accordance with one embodiment. FIG. 13 is a cross-sectional view of pigtail 235 extending through pigtail exit 238 in accordance with one embodiment.

Referring to FIGS. 9-13, although most of the connections are intra-cassette connections between connectors 204 of cable cassette 114C, in this embodiment, external connection via pigtail 235 having pigtail connector 236 to other components is needed. For example, pigtail connector 236 connects to one or more management modules of electronic device 100. In another example, control signals and/or power are input and/or output from cable cassette 114C on pigtail connector 236.

Accordingly, cabling 212 of cable cassette 114C is connected to pigtail connector 236 of pigtail 235 that extends through pigtail exit 238 for external connection to cable cassette 114C.

Pigtail exit 238 provides the following in one embodiment:
1—Guidance of cables 212 toward the location in chassis 102;
2—Strain relief;
3—EMI (ElectroMagnetic Interference) sealing;
4—Adjustability for differences in routing of cables 212; and
5—Protection of cables 212.

Pigtail exit 238 includes a pigtail opening 240 in cover 232A of cable cassette 114C as a fixed portion and a movable lid 242 as a movable portion.

A lower guide 244 at a lower edge of pigtail opening 240 is hemmed over to prevent chaffing of a pigtail cable bundle 246 of cables 212 of pigtail 235. Lower guide 244 extends downward at an angle from pigtail opening 240 to provide guidance and direct pigtail cable bundle 246 downward. Movable lid 242 allows pigtail cable bundle 246 to be brought out and positioned before sealing. It has a similar hemmed guide 247 as lower guide 244.

Pigtail connector 236 on the end of cables 212 is larger than cables 212 themselves, so the final opening needs to be smaller than that needed during assembly. The position of movable lid 242 is fixed with nuts or other fasteners 248. Movable lid 242 can slide up or down while being constrained by slots 250 and fasteners 248.

Another embodiment has side shields 252 that constrain cables 212 side to side motion.

The side shields 252 sit outbound of the lower guide 244 and movable lid 242. EMI sealing can be enhanced through foam or other types of gasketing 254 applied to the surfaces of pigtail opening 240.

Gasketing 254 also provides a complaint surface that conforms to irregularities in pigtail cable bundle 246. In one embodiment, cables 212 are enclosed in a sheath 256, metallic for EMI or not, to enhance the compliance and to better shield for EMI.

Other embodiments include one or more of the following:
1—Multiple apertures;
2—Multiple cables;
3—Different surfaces for the cable egress;
4—Different egress directions;
5—Both upper and lower guides being movable;
6—Different shaped apertures;
7—Different sliding mechanisms;
8—Different lid attachments;
9—Conductive stuffing for EMI sealing;
10—and others.

As discussed above, cabling 212 of cable cassettes 114, e.g., cable cassette 114C, are high performance to allow signals (data) to be propagated over a relatively large distance without a large impedance loss. However, in certain applications, it is desirable to replace the high performance cabling with a lower cost solution.

Figure 14:
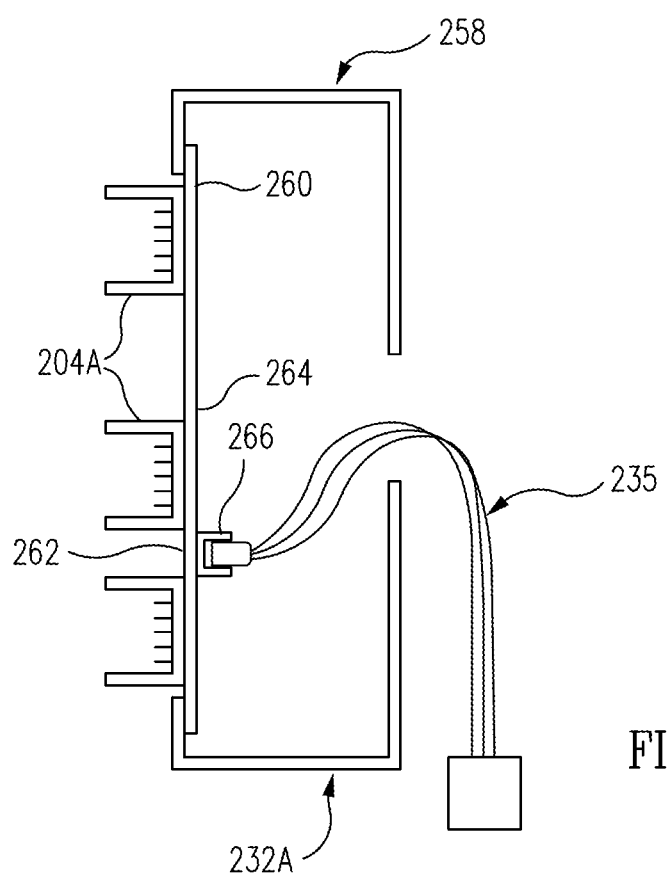
FIG. 14 is a cross-sectional view of a proxy backplane cassette in accordance with one embodiment.

Referring to FIG. 14, a proxy backplane cassette 258 in accordance with one embodiment is illustrated. In accordance with this embodiment, instead of using high performance cabling, the intra-cassette connections of the proxy backplane cassette 258 are formed using a printed circuit board (PCB) 260. Printed circuit board 260 is a lower cost material than high performance cabling 212 as described above in one embodiment. Further, assembly of individual cabling 212 to connectors 204 is avoided thus also minimizing labor costs.

Printed circuit board 260 includes traces that form the intra-cassette connections between connectors 204A of proxy backplane cassette 258. In one embodiment, connectors 204A are press fitted to printed circuit board 260 on the outward facing surface 262 (the surface that faces bulkhead 112) of printed circuit board 260. On the opposite inward facing surface 264 of printed circuit board 260, an internal connector 266 is provided for pigtail 235 that provides external connection to proxy backplane cassette 258.

Generally, the cable proxy 258, sometimes called the proxy backplane cassette 258, as illustrated in FIG. 14 is an interconnection system that can take the place of a cable cassette 114 as discussed above. It uses the same mounting, alignment, and attachment techniques as a cable cassette 114. No change to chassis 102 is required.

Proxy backplane cassette 258 has at least one or more of the following features:
1—Lower cost version but with some signal integrity limitations (not critical for its intended application);
2—Faster time-to-market;
3—Easier to produce/multiple vendors/faster; and
4—Lower profile for specialized testing/burn-in use cases.

Cable proxy 258 as illustrated in FIG. 14 uses printed circuit board 260 and press-fit connectors 204A to implement the interconnection network. Cable connectors 204A are designed to be compatible with traditional PCB connectors.

Cable proxy 258 of FIG. 14 uses connectors 204A, 266 which only have the mating connector alignment pins for blades 118. Printed circuit board 260 has additional holes for mounting the bulkhead registration pins, e.g., similar to guidepins 208 as described above, to printed circuit board 260. Printed circuit board 260 is designed to present the same connector locations and features as cable cassette 114 as described above. Pigtail 235 comes off the additional inward facing internal connector 266 as there are no longer any cables in one embodiment. The same cassette cover, e.g., cover 232A as described above, is used with cable proxy 258 in one embodiment. In one embodiment, cable proxy 258 is low profile since there are not many cables, if any, contained in cable proxy 258.

Figure 15:
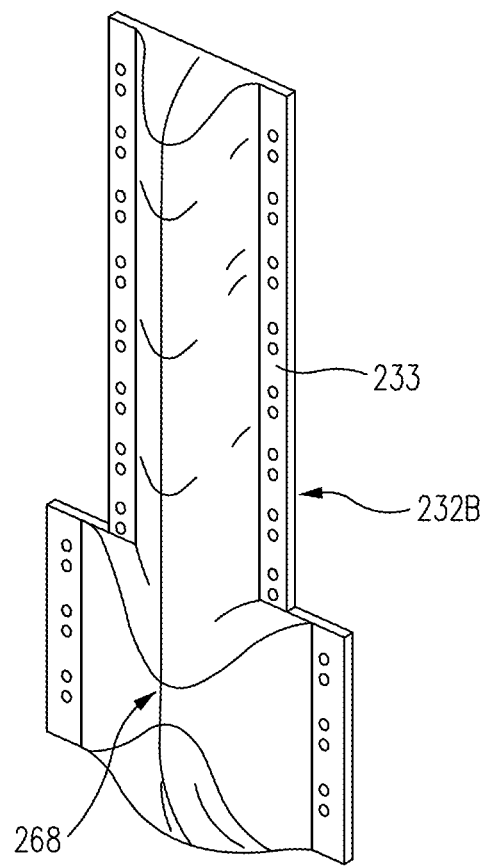
FIG. 15 is a perspective view of an aerodynamic protective cover for a cable cassette in accordance with one embodiment.

FIG. 15 is a perspective view of an aerodynamic protective cover 232B, sometimes called a cassette cover 232B, for a cable cassette in accordance with one embodiment. Referring to FIGS. 8 and 15 together, the box like. e.g., having 90° bends, cassette cover 232 of FIG. 8 may provide resistance to air flow through electronic device 100 in a front to back (or vice versa) air flow system design. By blocking airflow through the system, chassis airflow impedance is increased while at the same time thermal performance is degraded.

Accordingly, as illustrated in FIG. 15, a cassette cover 232B, sometimes called an aerodynamic cover 232B, is formed of smooth curves 268 instead of abrupt corners. Cassette cover 232B is used in place of cover 232 of FIG. 8 to form a cable cassette 114. In one embodiment, aerodynamic cover 232B is formed of plastic, e.g., to simplify manufacturing and reduce fabrication costs, but is formed of other materials in other embodiments.

By forming aerodynamic cover 232B of smooth curves 268, air flow efficiency around aerodynamic cover 232B is improved as compared to a box like cover. By improving air flow efficiency, power usage of fans, e.g., see fans 126 of FIG. 1, and possibly less or smaller fans usage is possible.

More particularly, a cable cassette 114 having aerodynamic cover 232B decreases chassis impedance allowing air to pass more easily past the cable cassette 114. Potential acoustical reduction is possible as well since the area at the back of aerodynamic cover 232B is reduced, reducing the blockage at the fans 126.

Figure 16:
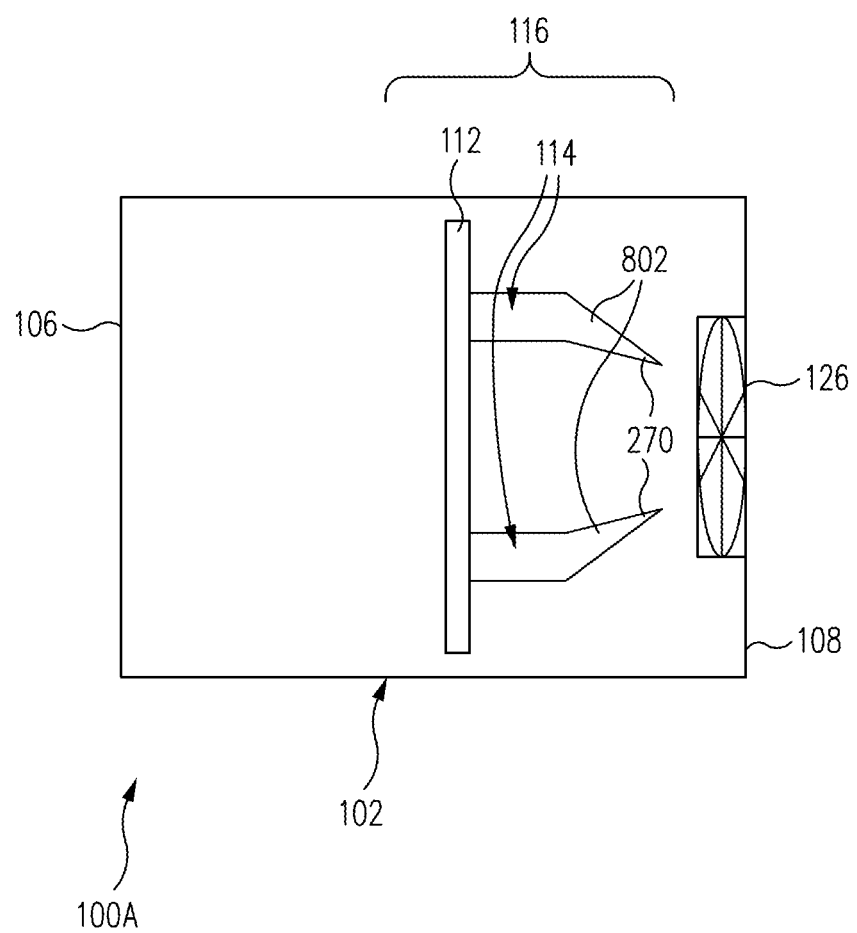
FIG. 16 is a top plan view of an electronic device having aerodynamic covers in accordance with one embodiment.

FIG. 16 is a top plan view of an electronic device 100A having aerodynamic covers 802 similar to the electronic device 100 of FIG. 1 in accordance with one embodiment. For simplicity, only bulkhead 112, two cable cassettes 114, and one fan 126 are illustrated inside of chassis 102 although it is to be understood that other components would be present depending upon the particular application.

As shown in FIG. 16, cassette covers 802 of the cable cassettes 114 are aerodynamically shaped to direct air flow through electronic device 100A in a desired manner. For example, cassette covers 802 have tails 270 that point at fan 126, e.g., towards the center of fan 126. Accordingly, air flowing through electronic device 100A is directed towards fan 126, for example, to improve efficiency of air flow through electronic device 100A.

Although FIG. 16 provides one example of using aerodynamic cassette covers 802 to preferentially direct air flow through electronic device 100A, in other embodiments, air flow is directed in other manners depending upon the particular application. For example, air flow is directed by a cassette cover at a particular component of electronic device 100A to provide cooling thereof.

Figure 17:
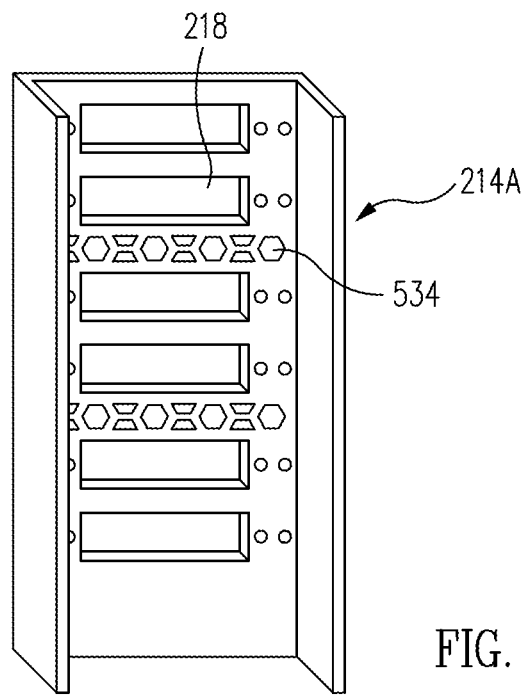
FIG. 17 is a rear perspective view of a front template for a cable cassette in accordance with one embodiment.
Figure 18:
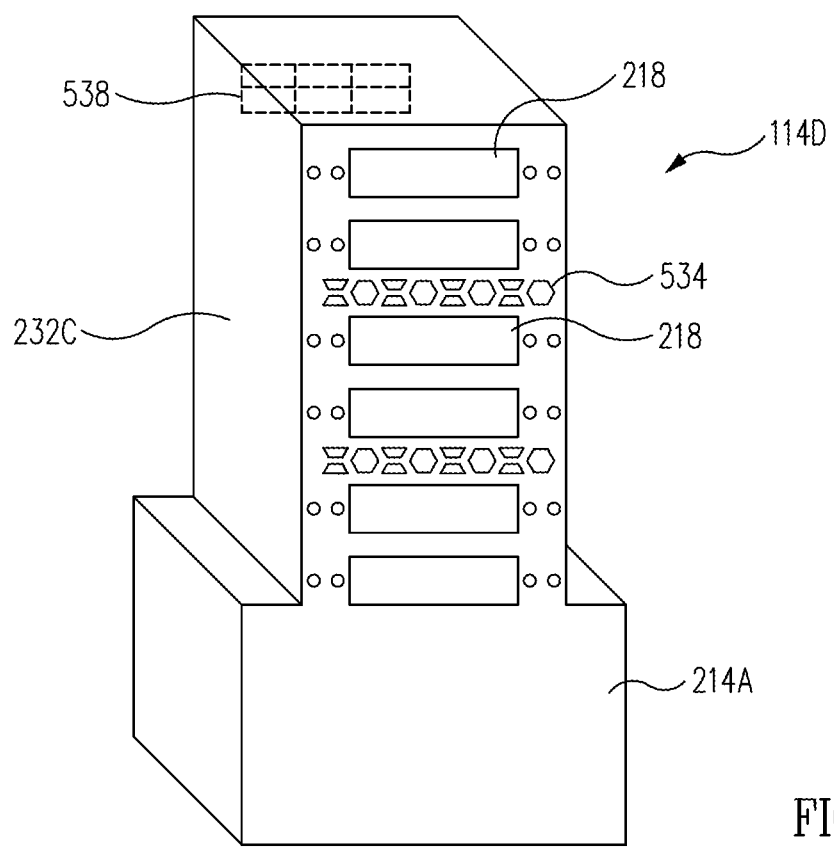
FIG. 18 is a front perspective view of a cable cassette including the front template of FIG. 17 in accordance with one embodiment.

FIG. 17 is a rear perspective view of a front template 214A for a cable cassette in accordance with one embodiment. FIG. 18 is a front perspective view of a cable cassette 114D including front template 214A of FIG. 17 in accordance with one embodiment. Cable cassette 114D and front template 214A of FIG. 18 are similar to cable cassettes 114 and front template 214 of FIG. 8, respectively, as discussed above in one embodiment.

Referring to FIGS. 17 and 18 together, cable cassette 114D includes front template 214A, connectors, cabling, guidepins, and a protective cover 232C, sometimes called a cassette cover 232C. The connectors, cabling, and guidepins are not illustrated for purposes of simplicity.

The cabling of cable cassette 114D, e.g., twin axial cabling, provides intra-cassette connections between the connectors of cable cassette 114D. The cabling of cable cassette 114D allows the connectors to be located at a distance from one another while allowing high speed data to be propagated without large signal strength losses. The connectors include signal pins to which blades, e.g., see blades 118 of FIG. 1, are electrically connected thereto.

Further, front template 214A includes one or more perforations 534, sometimes called perforation patterns 534, located vertically between connector openings 218. In accordance with this embodiment, perforation patterns 534 include a pattern of openings, e.g., a horizontally alternating hexagonal opening and pair of trapezoidal openings. In one embodiment, the size of the openings of perforation patterns 534 is sufficient large to allow adequate airflow therethrough vet sufficiently small to prevent electromagnetic interference (EMI) leakage therethrough. In one embodiment, there is a single perforation 534 that is just one big cutout for airflow.

Protective cover 232C also includes one or more perforations 538, e.g., perforation patterns similar to perforation patterns 534 of front template 214A.

Referring to FIGS. 1, 17 and 18 together, during use, fans 126 cause air to flow through electronic device 100 in a front to back (or vice versa) air flow system design. More particularly, air flows between front face 106 and rear face 108. Cable cassettes 114 and bulkhead 112 are located along the front to back air flow pathway and can impede the airflow.

Figure 19:
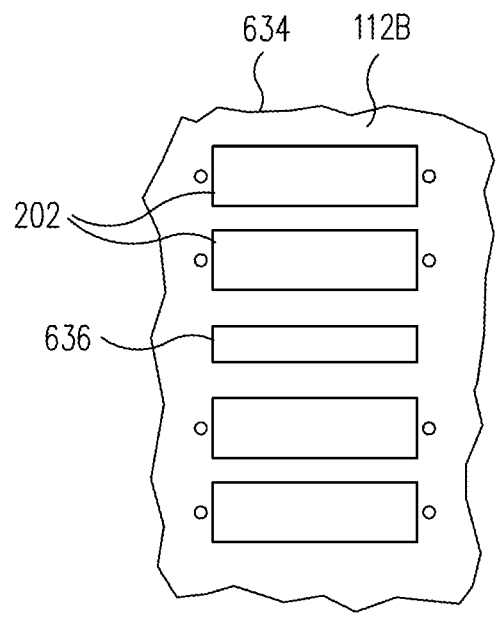
FIG. 19 is a front plan view of a section of a bulkhead of a bulkhead assembly in accordance with one embodiment.
Figure 20:
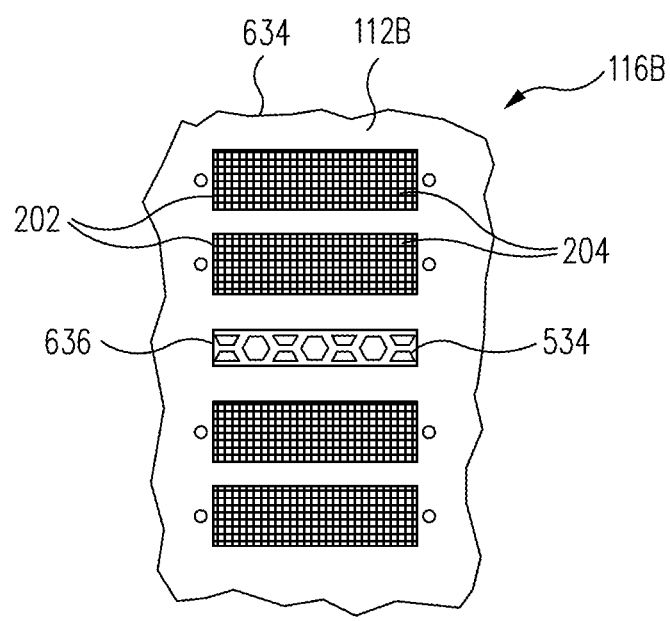
FIG. 20 is a front plan view of the section of the bulkhead assembly including the bulkhead of FIG. 19 and the cable cassette of FIG. 18 in accordance with one embodiment.

FIG. 19 is a front plan view of a section 634 of a bulkhead 112B of a bulkhead assembly 116B in accordance with one embodiment. FIG. 20 is a front plan view of section 634 of bulkhead assembly 116B including bulkhead 112B of FIG. 19 and cable cassette 114D of FIG. 18 in accordance with one embodiment. Bulkhead 112B and bulkhead assembly 116B of FIGS. 19-20 are similar to bulkhead 112 and bulkhead assembly 116 of electronic device 100 of FIG. 1.

Referring to FIGS. 17-20 together, bulkhead 112B includes cable cassette perforation inlet ports 636 and cable cassette connector ports 202, e.g., rectangular cutouts. Although ports 636, 202 are illustrated as being rectangular cutouts, in other embodiments, ports 636, 202 have other shapes or patterns. Cable cassette connector ports 202 are sometimes called cutouts 202.

As illustrated in FIG. 20, cable cassette 114D is mounted to bulkhead 112B such that connectors 204 of cable cassette 114D fit within cable cassette connector ports 202. Further, perforation patterns 534 of front template 214A are aligned with cable cassette perforation inlet ports 636.

Accordingly, during use, air flows through cable cassette 114D. More particularly, air flows through cable cassette perforation inlet ports 636 of bulkhead 112B and enters cable cassette 114D through perforation patterns 534 of front template 214A. Air flows through cable cassette 114D and exits through perforation pattern 538 of protective cover 232B. Air flow can be reversed in other embodiments.

Thus, according to the embodiments of FIGS. 17-20, air flows through cable cassettes 114D. This facilitates airflow through the system thus minimizing airflow impedance and maximizing thermal performance of the system.

Figure 21:
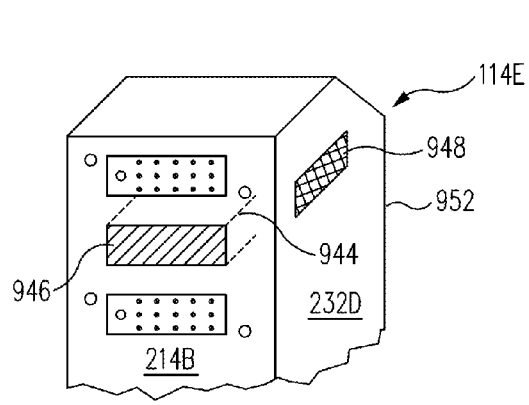
FIG. 21 is a front perspective view of a cable cassette having an airflow duct therein in accordance with one embodiment.
Figure 23:
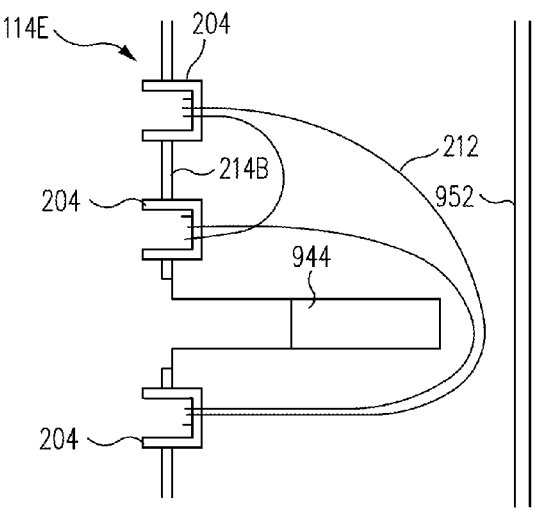
FIG. 23 is a cross-sectional view of the cable cassette having the duct unit of FIGS. 21-22 in accordance with one embodiment.
Figure 22:
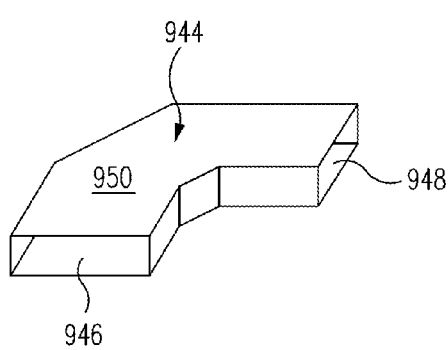
FIG. 22 is a perspective view of the duct unit for the cable cassette of FIG. 21 in accordance with one embodiment.
Figure 24:
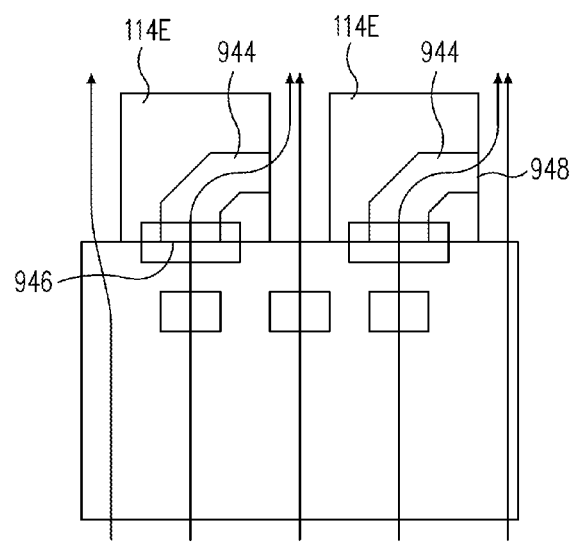
FIG. 24 is a top plan view showing front to back airflow through duct units of cable cassettes in accordance with one embodiment.

FIG. 21 is a front perspective view of a cable cassette 114E having an airflow duct 944, sometimes called a duct unit 944, therein in accordance with one embodiment. FIG. 22 is a perspective view of duct unit 944 for cable cassette 114E of FIG. 21 in accordance with one embodiment. FIG. 23 is a cross-sectional view of cable cassette 114E having duct unit 944 of FIGS. 21-22 in accordance with one embodiment. FIG. 24 is a top plan view showing front to back airflow through duct units 944 of cable cassettes 114E in accordance with one embodiment.

As illustrated in FIGS. 21-24, duct unit 944 include an inlet port 946, sometimes called an air inlet, and an outlet port 948, sometimes called a side exhaust. Outlet port 948 is perpendicular to inlet port 946 in accordance with this embodiment. A duct body 950 defines a channel that extends between inlet port 946 and outlet port 948.

A cable cassette protective cover 232D of cable cassette 114E includes a rear wall 952 parallel to a front template 214B of cable cassette 114E. In other embodiments, rear wall 952 has any one of a number of shapes and/or is not parallel to front template 214B. Protective cover 232D further includes sidewalls 954 extending perpendicularly from front template 214B to rear wall 952 of cable cassette 114E.

Inlet port 946 of duct unit 944 is located at front template 214B of cable cassette 114E. Outlet port 948 is located at a sidewall 954 of protective cover 232D of cable cassette 114E. Although outlet port 948 is illustrated as being at sidewall 954, in other embodiments, outlet port 948 is located at any surface of protective cover 232D, e.g., at the top, bottom, side, or straight through. In one embodiment, inlet port 946 of duct unit 944 is aligned with a cable cassette perforation inlet port 636 of bulkhead 112B, sometimes called the cable backplane (a cable cassette perforation inlet port 636 is illustrated in FIG. 19 for example).

As illustrated in FIG. 23, at least some of the cables 212 of cable cassette 114E extend between the connectors 204 of cable cassette 114E and around duct unit 944. More particularly, at least some of cables 212 are located between duct unit 944 and the rear wall 952 of cable cassette 114E.

During use, air flows through inlet port 946 of duct unit 944, through the channel of the duct unit 944, and exits outlet port 948 of duct unit 944. As illustrated in FIG. 24, in this manner, air flows through cable cassettes 114E through duct units 944. This facilitates airflow through the system thus minimizing airflow impedance and maximizing thermal performance of the system.

The drawings and the forgoing description gave examples of embodiments. The scope of the embodiments, however, is by no means limited by these specific examples. Numerous variations, whether explicitly given in the specification or not, such as differences in structure, dimension, and use of material, are possible.

What is claimed is:

1. An electronic device comprising:
   a bulkhead assembly comprising:
   a bulkhead comprising guidepin guideholes; and
   a cable cassette coupled to the bulkhead, the cable cassette comprises floating connectors, guidepins of the floating connectors being located within the guidepin guideholes.

2. The electronic device of claim 1 wherein the cable cassette further comprises cables forming intra-connections between the floating connectors and within the cable cassette.

3. The electronic device of claim 1 wherein the bulkhead comprises cutouts, the floating connectors being located within the cutouts.

4. The electronic device of claim 1 wherein a diameter of the guidepin guideholes is approximately equal to a diameter of the guidepins.

5. The electronic device of claim 4 wherein the cable cassette comprises a front template comprising guidepin openings therein in which the guidepins are located, the guidepin openings having a larger diameter than the diameter of the guidepins.

6. The electronic device of claim 1 wherein the bulkhead further comprises bulkhead screw holes adjacent the guidepin guideholes, the cable cassette being coupled to the bulkhead with bulkhead screws located within the bulkhead screw holes.

7. The electronic device of claim 6 wherein the cable cassette comprises a front template comprising bulkhead screw openings in which the bulkhead screws are located, a diameter of the bulkhead screw openings being larger than a diameter of the bulkhead screws.

8. An electronic device comprising:
   a cable cassette comprising:
   a connector comprising:
   a connector plug;
   a connector body; and
   guidepins extending from the connector body;
   a front template comprising:
   a connector opening having the connector plug located therein, the connector plug configured to float within the connector opening; and
   guidepin openings having the guidepins located therein, the guidepins configured to float within the guidepin openings.

9. The electronic device of claim 8 wherein the cable cassette further comprises:
   a plurality of connectors comprising the connector; and
   cables coupled to the connectors.

10. The electronic device of claim 9 further comprising a protective cover coupled to the front template around the cables.

11. The electronic device of claim 9 wherein the cable cassette further comprises a protective fabric around the cables.

12. The electronic device of claim 10 wherein the protective cover is aerodynamically shaped.

13. The electronic device of claim 10 wherein the protective cover comprises a pigtail exit, the cable cassette further comprising a pigtail comprising a pigtail connector extending through the pigtail exit.

14. The electronic device of claim 8 further comprising:
    a bulkhead comprising:
    a cable cassette connector port configured to receive the connector of the cable cassette; and
    a cable cassette perforation inlet port configured to provide airflow to the cable cassette.

15. The electronic device of claim 14 wherein the cable cassette comprises a front template comprising a perforation pattern aligned with the cable cassette perforation inlet port.

16. The electronic device of claim 14 wherein the cable cassette comprises a duct unit comprising an inlet port aligned with the cable cassette perforation inlet port.

17. A method comprising:
provide a cable cassette comprising connectors that float relative to a front template of the cable cassette; and
inserting guidepins of the connectors into guidepin guideholes of a bulkhead to move the connectors relative to the front template and into alignment with cutouts in the bulkhead.

18. The method of claim 17 wherein cable cassette comprises cables coupled to the connectors, the method further comprising protecting the cables with a cover of the cable cassette.

19. The method of claim 17 further comprising providing airflow through the cable cassette.

* * * * *